United States Patent [19]

Igarashi et al.

[11] Patent Number: 5,469,953
[45] Date of Patent: Nov. 28, 1995

[54] TRANSPORT MECHANISM FOR IC HANDLERS

[75] Inventors: Noriyuki Igarashi, Gyoda; Keiichi Fukumoto, Kitamoto, both of Japan

[73] Assignee: Advantest Corporation, Tokyo, Japan

[21] Appl. No.: 197,190

[22] Filed: Feb. 16, 1994

[30] Foreign Application Priority Data

Feb. 17, 1993 [JP] Japan .................. 5-010643 U

[51] Int. Cl.⁶ .................................. B65G 47/00
[52] U.S. Cl. .................. 198/345.2; 198/471.1; 198/803.5
[58] Field of Search ............... 198/345.2, 346.3, 198/471.1, 803.5; 414/223, 225; 29/593; 209/571–574, 905, 919

[56] References Cited

U.S. PATENT DOCUMENTS

| | | | |
|---|---|---|---|
| 2,915,201 | 12/1959 | Calehuff et al. | 198/803.5 |
| 4,261,681 | 4/1981 | Gates | 414/225 |
| 4,763,405 | 8/1988 | Morita et al. | 29/593 |
| 4,907,701 | 3/1990 | Kobayashi et al. | 414/225 |

*Primary Examiner*—Joseph E. Valenza
*Attorney, Agent, or Firm*—Staas & Halsey

[57] ABSTRACT transport mechanism for integrated circuit (IC) handlers with four transport stations spaced 90° apart on one circumference are supported by a cross-shaped contact arm, and below the circumference, contact-in, contact or test and contact-out stages are provided at intervals of 90°. Each transport station has a vertically movable air chuck unit and an air chuck driving mechanism for driving the air chuck unit vertically and holding by suction and releasing devices under test. The transport station that has reached a predetermined position above the contact-in stage presses the air chuck unit down with the air chuck driving mechanism and suck and lifts the devices to be tested off the contact-in stage. In parallel with the operation at the contact-in stage, the transport station, staying above the contact or test stage, lowers the air chuck unit which holds devices to be tested and fixes them onto the contact or test stage to start testing them, and the transport station above the contact-out stage lowers the air chuck unit holding tested devices and releases them onto the contact-out stage, thereafter raising the empty air chuck unit. Each time the contact arm is turned 90°, these operations are repeated.

2 Claims, 4 Drawing Sheets

TRANSPORT MECHANISM FOR IC HANDLERS

BACKGROUND OF THE INVENTION

The present invention relates to a conveyor or transport mechanism by which devices under test (DUTs) are conveyed or transferred simultaneously from a contact-in stage to a contact or test stage and from the test stage to a contact-out stage in an IC handler or an IC tester.

In a conveyor or transport mechanism of a conventional IC handler, as shown in FIGS. 1A and 1B, a contact-in stage 10A for feeding ICs to be tested, a test stage 10B for testing ICs and a contact-out stage 10C for taking out tested ICs are aligned at equal intervals L, and above them, a contact arm 4 extending in parallel to their alignment is disposed in a manner to be movable from side to side. On the contact arm 4 there are mounted two vertically moving air chuck units 6A and 6B at the distance L from each other. The contact arm 4 travels in a horizontal direction between a first position P1 where the air chuck units 6A and 6B lie just above the contact-in stage 10A and the test stage 10B, respectively, and a second position P2 where they lie just above the test stage 10B and the contact-out stage 10C, respectively. On the contact arm 4 there are mounted air cylinders 8A and 8B, by which the air chuck units 6A and 6B can be driven up and down.

In the conventional IC handlers, DUTs are transferred by repeating such a cycle of operation as shown in FIG. 1C. At first, as shown in FIG. 1A, the contact arm 4 is at the first position P1, where the air chuck units 6A and 6B are lowered by the air cylinders 8A and 8B and suck up an IC $5_2$ to be tested from the contact-in stage 10A and a tested IC $5_1$ from the test stage 10B, respectively. For convenience' sake, this step will be referred to as step S3. The air chuck units 6A and 6B holding the ICs $5_1$ and $5_2$ are driven by the air cylinders 8A and 8B back to their upper positions (step S4), after which the contact arm 4 is driven to the left and stops at the second position P2 (step S5).

At the second position P2, as shown in FIG. 1B, the air chuck units 6A and 6B are brought down (step S6) and the tested IC $5_1$ held by the air chuck unit 6B is released onto the contact-out stage 10C. At the same time, the IC $5_2$ to be tested next is loaded onto an IC socket (not shown) of the test stage 10B and held with all of its pins pressed against corresponding pins of the socket until the end of the test. While the IC $5_2$ is tested with its pins fixed by the air chuck unit 6A, an IC $5_3$ to be tested next is fed to the contact-in stage 10A. Upon completion of the test, the ICs $5_2$ and $5_1$ are left on the test stage 10B and the contact-out stage 10C, respectively, and the air chuck units 6A and 6B are returned to their upper positions (step S1), after which the contact arm 4 is brought to the right-hand first position P1 (step S2). In this while, the tested IC $5_1$ on the contact-out 10C is taken out therefrom.

At the first position P1, as indicated by the broken lines in FIG. 1B, the air chuck units 6A and 6B are lowered (step S2), then the air chuck unit 6A sucks up thereto the IC $5_3$ to be tested next from the contact-in stage 10A and the air chuck unit 6B sucks up thereto the tested IC $5_2$ from the test stage 10B. Thereafter, step S3 and the subsequent steps, described above, are repeated.

The time interval from the end of IC test to the beginning of the next IC test will hereinafter be called an index time. The index time in the conventional IC handler is composed of steps S1 through S6 as shown in FIG. 1C, but steps S1, S2 and S3 are performed with no ICs held by the air chuck units 6A and 6B. Because of such lost motion of the air chuck units in the transfer steps of the index time, the prior art conveyor or transport mechanism requires many transfer steps and hence is inefficient in operation; accordingly, much time is needed to test a number of ICs.

SUMMARY OF THE INVENTION

It is therefore an object of the present invention to provide a transport mechanism for IC handlers which has a short index time.

According to the present invention, at least three transport stations disposed at an equiangular distance on the perimeter of a circle are supported by a contact arm having its rotary shaft at the center of the circle, and below the circle, a contact-in stage, a contact or test stage and a contact-out stage are disposed just under the above-mentioned perimeter at the same angular distance as mentioned above. Each transport station has a vertically moving air chuck unit, and each stage has a mechanism for driving the air chuck unit vertically, by which devices under test are sucked, fixed and released.

When any one of the transport stations has reached a predetermined position just above the contact-in stage by the rotation of the contact arm, the transport station pushes down the air chuck unit by an up-and-down driving mechanism, sucks up to the air chuck unit ICs to be tested from the contact-in stage and then raises the air chuck unit. In parallel with the operation at the contact-in stage, the carrier above the contact or test stage lowers the air chuck unit holding ICs to be tested and fixes them to the test stage for testing. At the same time, the transport station above the contact-out stage lowers the air chuck unit holding tested ICs, releases them onto the contact-out stage and then raises the empty air chuck unit.

Upon completion of the test, the air chuck unit holding the tested ICs is raised by the up-and-down driving mechanism, after which the contact arm turns and the above-described operations are repeated. Thus, the index time comprises only the steps of turning the contact arm in one direction through an angle equal to the angular distance between the respective stages and bringing up and down the air chuck unit.

DESCRIPTION OF TEE PREFERRED EMBODIMENT

Figure 2:
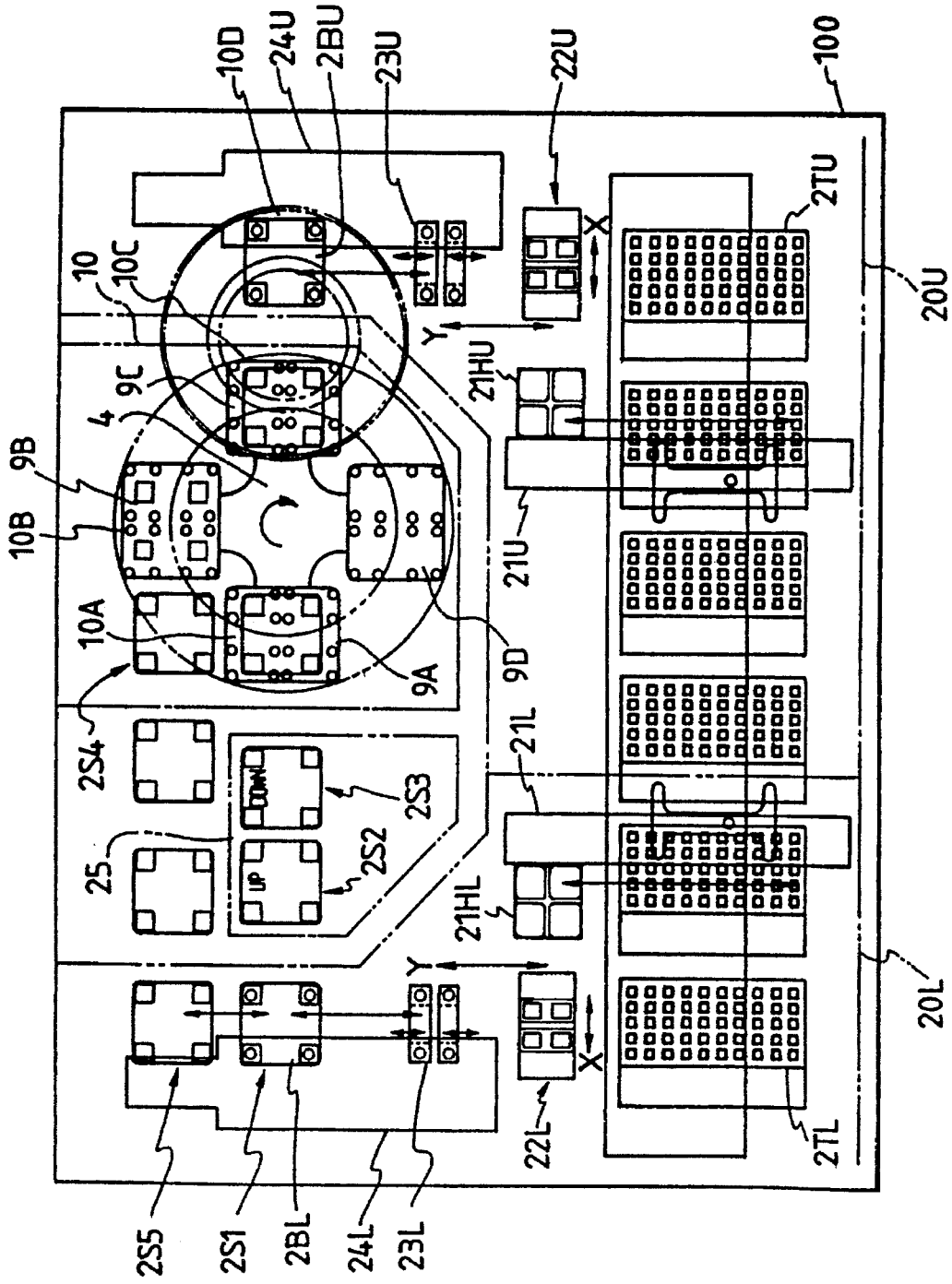
FIG. 2 is a plan view of an IC handler embodying a transport mechanism of the present invention.

FIG. 2 shows the relationship between the entire IC handler structure and the transport mechanism of the present invention incorporated therein. A conveyor or transfer system of the IC handler is mounted on a horizontally-placed rectangular base plate 100 and is comprised substantially of a loader section 20L, an unloader section 20U, a soak chamber 25 and a test chamber 10. The transport mechanism of the present invention is provided in the test chamber 10. In the illustrated embodiment of the invention, there are disposed a contact-in stage 10A, a contact or test stage 10B and a contact-out stage 10C at 90° intervals on the perimeter of a circle parallel to the top surface of the base plate 100. Above these stages there are supported four transport stations 9A, 9B, 9C and 9D by a cross-shaped contact arm 4 at 90° intervals on the perimeter of a circle concentric with and equal in diameter to the above-mentioned circle. The soak chamber 25 is provided to heat ICs under test up to a predetermined temperature.

Carrier arms 21L and 21U are movable in the X direction and heads 21HL and 21HU mounted on the carrier arms 21L and 21U are movable thereon in the Y direction and each have four air chucks (not shown). The head 21HL on the carrier arm 21L picks up untested ICs by the air chucks from a tray 2TL in groups of four in this example and transfers them to a buffer stage 22L. The buffer stage 22L provides predetermined spacing between the ICs of a two-by-two array in the X direction. The ICs thus spaced apart in the X direction on the buffer stage 22L are picked up by a carrier 23L movable on a buffer arm 24L, spaced out by a predetermined value in the Y direction to form a square array and then placed in four corners of a square empty boat 2BL in a chamber-in stage 2S1. The boat 2BL is brought into the soak chamber 25 having its interior heated up to a predetermined temperature and it is inserted into the lowermost position at a stack stage 2S2 where boats are already stacked on top of each other in layers. Then, the boat 2BL is raised step by step and at the uppermost position it is shifted horizontally to the adjoining stack stage 2S3 and is then lowered step by step. The devices under test are heated to a predetermined temperature while traveling in the soak chamber 25 as mentioned above. When having reached the lowermost position of the stack stage 2S3, the boat 2BL is brought into the contact-in stage 10A, where the four ICs placed in the boat 2BL are picked up by the transport station 9A through air chucks described later on. The thus emptied boat 2BL is transferred to a stage 2S4 and then to a stage 2S5.

On the other hand, the ICs carried by the transport station 9A are brought by the turn of the cross-shaped contact arm 4 to the contact stage 10B and then to the contact-out stage 10C upon completion of the test. There are provided two boats which go around the contact-out stage 10C and a chamber-out stage 10D. In the contact-out stage 10C tested ICs are brought down from the transport station 9A onto a boat 2BU just under it and the boat 2BU is turned 180° to the chamber-out stage 10D. Then the four ICs are picked up by a carrier 23U that moves along a buffer arm 24U, by which the space between the ICs is lessened in the Y direction; then the ICs are placed on a buffer stage 22U. In the buffer stage 22U the spacing of the ICs is reduced in the X direction, after which the four square-arrayed ICs of reduced spacing are transferred onto an empty tray 2TU by the head 21HU of the carrier arm 21U.

Figure 3:
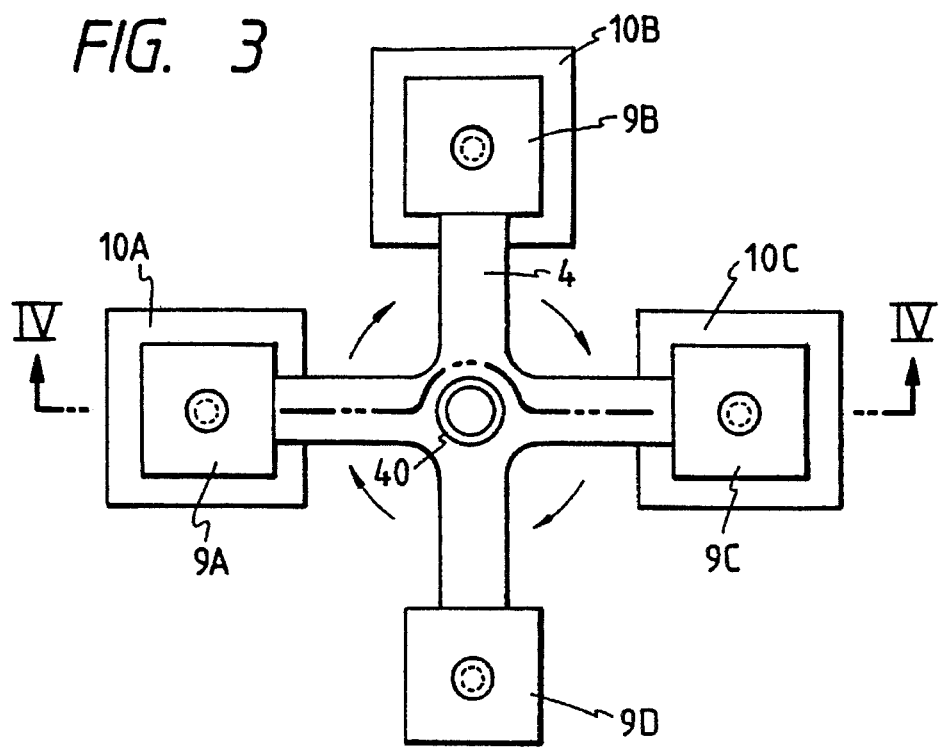
FIG. 3 is a plan view showing a principal part of the transport mechanism shown in FIG. 2.
Figure 4:
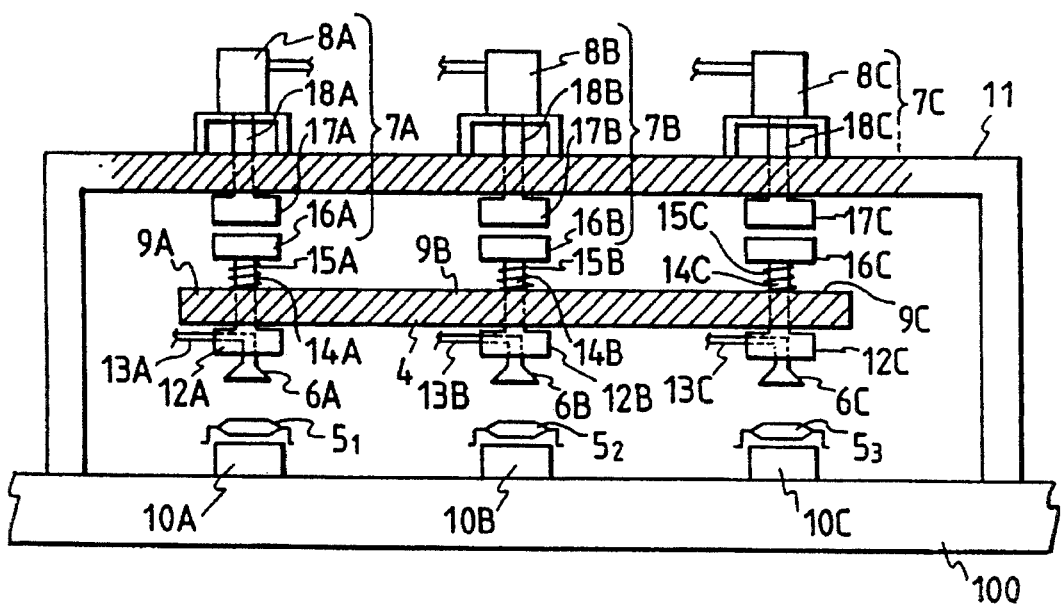
FIG. 4 is a side view showing the principal part of the transport mechanism shown in FIG. 2.

FIG. 3 shows the relationships between the contact-in stage 10A, the contact or test stage 10B and the contact-out stage 10C disposed at equiangular intervals of 90° in this embodiment and the four transport stations 9A, 9B, 9C and 9D that are mounted on the cross-shaped contact arm 4 at the same angular intervals as mentioned above and pass just above the above-said stages. FIG. 2 shows an example in which the transport stations 9A through 9D each have four air chucks not shown, but for the sake of brevity, in FIGS. 4 and 5 the transport stations 9A through 9D are each shown to have only one air chuck 6A through 6D, respectively. The contact arm 4 is turned clockwise about a hollow shaft 40 through 90° at one time in this embodiment. FIG. 4 is a sectional view taken on the line IV—IV bypassing the shaft 40 in FIG. 3. Reference numerals 7A through 7C denote air chuck driving mechanisms for selectively driving the air chucks 6A through 6D vertically.

Figure 1A:
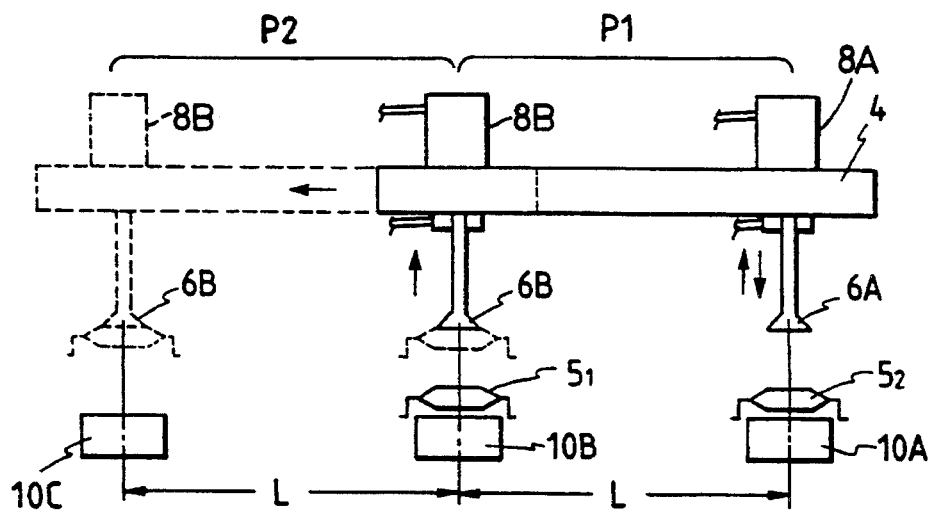
FIG. 1A is a side view showing a principal part of a conventional conveyor.
Figure 1B:
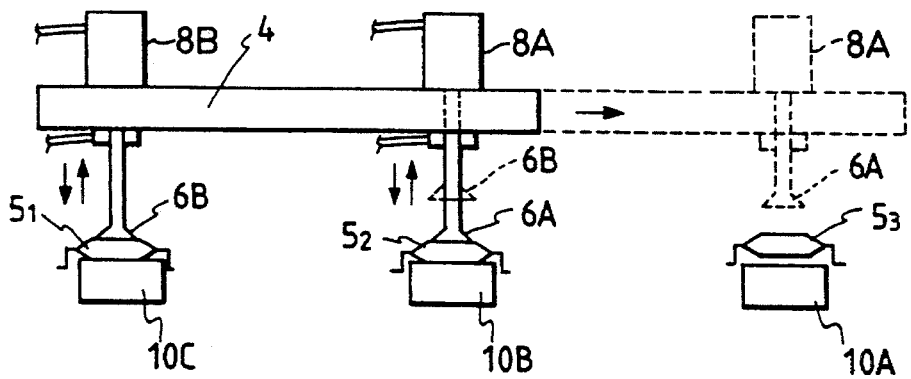
FIG. 1B is a side view showing the state in which a contact arm shown in FIG. 1A has been moved.

According to the present invention, three air cylinders 8A, 8B and 8C, each being one element of up-and-down driving mechanisms, respectively, for driving the air chucks 6A through 6D vertically are mounted on a table 11 fixed to the base plate 100 over the contact arm 4 so that they are positioned directly above the contact-in stage 10A, the contact or test stage. 10B and the contact-out stage 10C, respectively. Accordingly, unlike in the prior art example shown in FIGS. 1A and 1B, the air cylinders 8A, 8B and 8C are fixed independently of the turn of the contact arm 4. A driving shaft 18A of the air cylinder 8A passes through the table 11 and is movable up and down. On the other hand, the transport station 9A at one arm end of the cross-shaped contact arm 4 has a vertically movable sliding shaft 14A extending through the transport station 9A. The sliding shaft 14A is urged upward by a coiled spring 15A wound around it between the transport station 9A and a head 16A secured to the top of the shaft 14A. Attached to the lower end of the sliding shaft 14A is a joint 12A and the air chuck unit 6A is secured to the lower end face of the joint 12A. The air chuck unit 6A is connected via the joint 12A to an air suction tube 13A. By sucking air from the air chuck 6A through the tube 13A, the IC 5 is sucked to the air chuck 6A, and by leaking air to the air chuck 6A through the tube 13A, the IC 5 is released.

Lowering the driving shaft 18A by the air cylinder 8A when the transport station 9A lies just above the contact-in stage 10A, the head 17A affixed to the lower end of the shaft 18A strikes against the head 16A of the sliding shaft 14A and presses it down against the coiled spring 15A, bringing down the air chuck 6A into contact with the IC 5. Hence, the IC 5 can be sucked to the air chuck 6A by sucking therefrom air through the tube 13A. The other up-and-down driving mechanisms 7B and 7C and the other air chucks 6B, 6C and 6D are identical in construction with those described above. The air chucks 6A through 6D may be operable independently of one another and the air cylinders 8A, 8B and 8C are also operable independently of one another. The number of the up-and-down driving mechanisms is less than that of the air chucks in this embodiment because the contact arm 4 has four transport stations 9A, 9B, 9C and 9D, whereas there are three stages 10A, 10B and 10C. The up-and-down driving mechanisms, that is, air chuck driving mechanism 7A, 7B and 7C, are fixedly mounted on the table 11 at positions thereof above the stages 10A, 10B and 10C, and are operative to vertically drive the respective air chucks positioned above the stages 10A, 10B and 10C. Therefore, the number of the air chuck driving mechanisms is less than or equal to the number of air chucks depending upon the number of transport stations provided on the contact arm 4.

Figure 5:
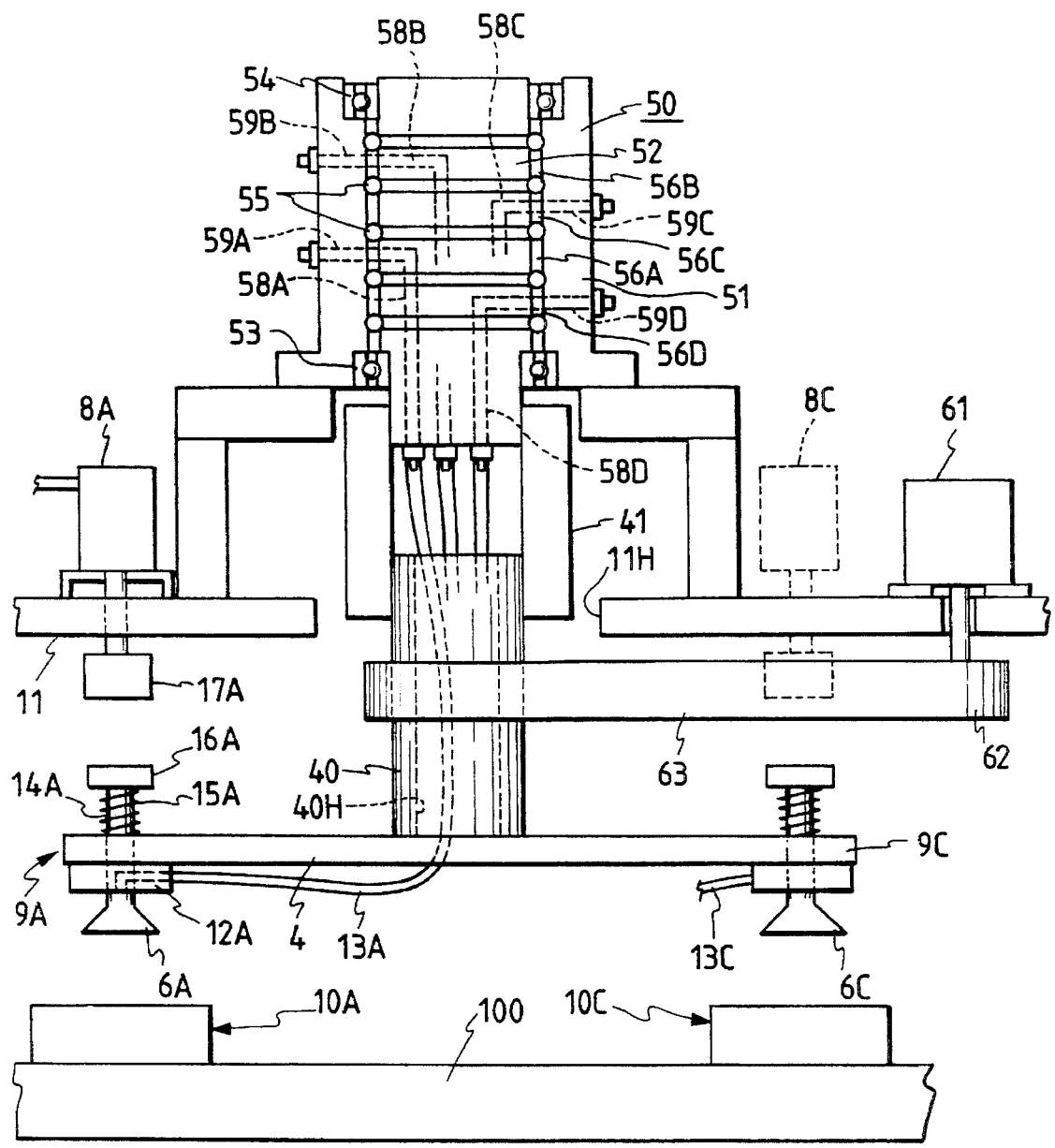
FIG. 5 is a vertical sectional view showing a mechanism shown in FIG. 2 for sucking air from an air chuck on a contact arm during rotation.

FIG. 5 illustrates a construction which permits suction of air from the air chucks 6A through 6D even when the contact arm 4 turns. The hollow shaft 40 of the contact arm 4 projects upwardly of the table 11 through a circular hole 11H made therein. On the table 11 there is mounted a rotary joint 50 coaxially or concentrically with the circular hole 11H.

The rotary joint 50 has a cylinder 51 and a rotary shaft 52 rotatably supported therein at both ends by bearings 53 and 54. In the gap between the inner wall surface of the cylinder 51 and the outer wall surface of the rotary shaft 52 there are disposed five O rings 55 in this embodiment at equal intervals axially of the rotary joint 50 to define four annular chambers 56A through 56D which are pneumatically isolated from one another. The rotary shaft 52 has through holes 58A through 58D which extend up axially thereof from its bottom and bend horizontally to communicate with the annular chambers 56A through 56D, respectively. In the side wall of the cylinder 51 there are also made therethrough holes 59A through 59D which extend from the outer wall surface of the cylinder 51 to the annular chambers 56A through 56D, respectively. The tubes 13A through 13D (the tube 13D being not shown) connected at one end to the joints 12A through 12D respectively (the joint 12D being not shown), are passed through the bore 40H of the hollow rotary shaft 40 of the contact arm 4 and coupled at the other ends to the through holes 58A through 58D in the bottom of the rotary shaft 40. On the other hand, the holes 59A through 59D of the cylinder 59 are connected to vacuum equipment (not shown) via tubes (also not shown).

On the table 11 there is mounted a motor 61 which has a rotary shaft extending down through the table 11, a belt 63 being stretched between a pulley 62 attached to the lower end of the rotary shaft of the motor 61 and the rotary shaft 40 of the contact arm 4. As the motor 61 is activated, the contact arm 4 turns and consequently the rotary shaft 52 turns which is coupled by a coupling 41 to the rotary shaft 40 of the arm 4. With such a construction, the rotary joint 50 allows independent suction of air therethrough from the air chucks 6A through 6D attached to the contact arm 4 while it is turned.

Figure 1C:
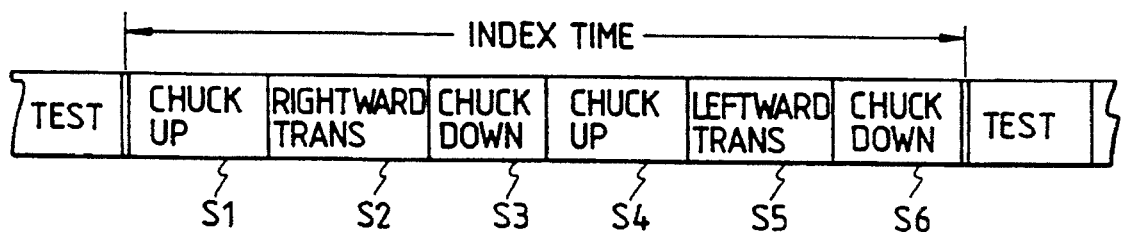
FIG. 1C shows a cycle of operation of the conventional conveyor.
Figure 6:
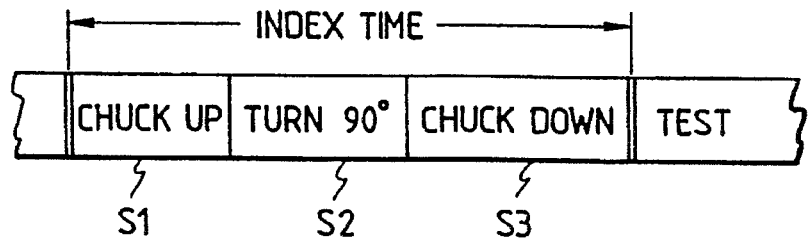
FIG. 6 shows a cycle of operation of the transport mechanism of FIG. 2.

The operation of the transport mechanism according to the present invention will be described with reference to FIGS. 3, 4 and 6. Now, let it be assumed that ICs currently present in the contact or test stage 10B have just been tested, that ICs to be tested next have already been brought to the contact-in stage 10A and that the air chucks 6A and 6B are held at their lowered positions in the stages 10A and 10B. The air chucks 6A and 6B are caused to suck the ICs thereto from the contact-in stage 10A and the contact or test stage 10B and then raised (step S1). Next, the contact arm 4 is turned 90° (step S2), during which the ICs to be tested next are brought to the contact-in stage 10A and the ICs tested previously are taken out from the contact-out stage 10C. When the transport stations 9A, 9B and 9D reach predetermined positions above the contact or test stage 10B, the contact-out stage 10C and the contact-in stage 10A, respectively, the air chucks 6A, 6B and 6D are lowered thereto (step S3) and in the contact or test stage 10B the ICs are tested. Thus, the index time of the operation by the transport mechanism according to the present invention comprises only three steps, and hence is far shorter than the index time of the prior art example shown in FIG. 1.

As will be seen from FIG. 3, since the above-described embodiment has four transport stations for three fixed stages, the contact arm 4 turns 90° each time, but it is also possible to employ a construction in which the three fixed stages are disposed at 120° intervals on the same circle and three transport stations are also mounted on three free ends of the contact arm extending at 120° intervals. That is, according to the present invention, three or more transport stations are mounted on the contact arm at equiangular intervals on the same circle and the contact-in and contact or test and contact-out stages 10A, 10B and 10C are disposed at the same angular intervals as those of the transport stations.

It will be apparent that many modifications and variations may be effected without departing from the novel concepts of the present invention.

What is claimed is:

1. A transport mechanism for an integrated circuit handler, comprising:

a base plate having a main surface in a horizontal plane;

rotatable contact arm means having a rotary shaft and at least three transport stations for carrying devices under test, said transport stations being disposed at equiangular intervals on a perimeter of a predetermined circle parallel to the main surface of said base plate, said rotary shaft passing through a center of the predetermined circle;

vertically slidable shafts having respective upper and lower ends and respectively provided in said transport stations;

a contact-in stage for feeding the devices under test, a test stage for testing the devices and a contact-out stage for taking out tested devices, said contact-in, test and contact-out stages being arranged on said base plate below said contact arm means at the same equiangular intervals as those of said transport stations and about said rotary shaft of said contact arm means on a perimeter of another circle having the same diameter as that of the predetermined circle;

air chuck means provided at each of said transport stations, for selectively holding by suction and releasing the devices under test, said air chuck means being mounted to the respective lower ends of said vertically slidable shafts;

a support table fixedly mounted on said base plate and extending over said contact arm means;

air chuck driving mechanism means fixed to said support table at positions thereof above said contact-in, test and contact-out stages, respectively, for selectively moving said air chuck means up and down by pressing down respective upper ends of said air chuck means and releasing pressure applied to the upper ends of said air chuck means when corresponding ones of said transport stations are held above said contact-in, test and contact-out stages, said air chuck driving mechanism means including respective vertically movable driving shafts having respective lower ends, each of said vertically movable driving shafts pressing down the respective upper end of a corresponding one of said vertically sliding shafts with the respective lower end of said corresponding vertically movable driving shaft to lower said corresponding air chuck means when ones of said transport stations lie above said contact-in, test and contact-out stages, respectively;

a rotary joint mounted on said support table, for rotatably supporting the rotary shaft of said contact arm means through an opening made in said support table, said rotary joint comprising:

a second rotary shaft having at least three through holes with one ends of which are open to an outer peripheral surface of said second rotary shaft at different positions in an axial direction thereof and the other ends of which are open to a lower end surface of said second rotary shaft at different positions, a cylinder to receive therein said second rotary shaft, and a plurality of O rings, interposed between said second rotary shaft and said cylinder, for forming at least three airtightly isolated annular chambers between the outer peripheral surface of said second rotary shaft and an inner peripheral surface of said cylinder, said annular chambers being disposed in the axial direction of said second rotary shaft, each of said annular chambers communicating with one of said one ends of said through holes; and coupling means for coupling said secondary rotary shaft to the rotary shaft of said contact arm means.

2. The transport mechanism of claim 1, wherein the number of said transport stations is four, and said transport stations are disposed at intervals of 90°.

* * * * *

UNITED STATES PATENT AND TRADEMARK OFFICE
CERTIFICATE OF CORRECTION

PATENT NO. : 5,469,953
DATED : November 28, 1995
INVENTOR(S) : Noriyuki IGARASHI, et al.

It is certified that error appears in the above-indentified patent and that said Letters Patent is hereby corrected as shown below:

Title Page, Column 2, under "Abstract", line 1, before "transport" please insert --A--.

Column 2, line 63, please delete "TEE" and substitute therefor --THE--.

Signed and Sealed this

Twenty-eighth Day of May, 1996

Attest:

BRUCE LEHMAN

*Attesting Officer*  *Commissioner of Patents and Trademarks*